United States Patent
Khandekar

(10) Patent No.: US 6,243,768 B1
(45) Date of Patent: *Jun. 5, 2001

(54) METHOD AND APPARATUS FOR CONTROLLING DATA TRANSFER BETWEEN A SYNCHRONOUS DRAM-TYPE MEMORY AND A SYSTEM BUS

(75) Inventor: Narendra S. Khandekar, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/209,956

(22) Filed: Dec. 10, 1998

Related U.S. Application Data

(63) Continuation-in-part of application No. 08/599,040, filed on Feb. 9, 1996, now Pat. No. 5,926,828.

(51) Int. Cl.[7] .................................... G06F 12/00
(52) U.S. Cl. ................... 710/35; 711/167; 711/105; 709/232; 365/233
(58) Field of Search ........................... 711/111, 105, 711/167, 218; 365/233.5; 710/35; 709/233

(56) References Cited

U.S. PATENT DOCUMENTS

| | | | |
|---|---|---|---|
| 4,792,926 | 12/1988 | Roberts | 365/189.02 |
| 5,134,699 | 7/1992 | Aria et al. | 395/855 |
| 5,159,679 | 10/1992 | Culley | 395/425 |
| 5,268,865 | 12/1993 | Takasugi | 365/189.05 |
| 5,321,651 | 6/1994 | Monk | 365/189.01 |
| 5,390,149 | 2/1995 | Vogley et al. | 365/189.01 |
| 5,469,577 | * 11/1995 | Eng et al. | 710/110 |
| 5,513,148 | 4/1996 | Zagar | 365/233 |
| 5,519,872 | 5/1996 | Khandekar et al. | 395/775 |
| 5,526,513 | 6/1996 | Cerutti | 395/496 |
| 5,530,944 | 6/1996 | Stones | 711/167 |
| 5,586,286 | 12/1996 | Santeler et al. | 711/105 |
| 5,600,605 | * 2/1997 | Schaefer | 365/233 |
| 5,640,517 | * 6/1997 | Parks et al. | 710/105 |
| 5,640,527 | 6/1997 | Pecone et al. | 711/5 |
| 5,657,287 | 8/1997 | McLaury et al. | 365/230.01 |
| 5,661,695 | * 8/1997 | Zagar et al. | 365/233.5 |
| 5,715,476 | * 2/1998 | Kundu et al. | 710/35 |
| 5,809,260 | * 9/1998 | Bredin | 710/128 |
| 5,897,667 | * 4/1999 | Miller et al. | 711/218 |
| 5,918,072 | * 6/1999 | Bhattacharya | 710/35 |
| 5,926,828 | * 7/1999 | Khandekar | 711/111 |
| 5,941,960 | * 8/1999 | Miller et al. | 710/35 |

FOREIGN PATENT DOCUMENTS

WO 95/06287 * 3/1995 (WO).

* cited by examiner

*Primary Examiner*—Do Hyun Yoo
*Assistant Examiner*—Hong Kim
(74) *Attorney, Agent, or Firm*—Blakely, Sokoloff, Taylor & Zafman LLP

(57) ABSTRACT

A method and an apparatus for a synchronous DRAM-type memory control is provided that allows continued and accurate data transfer to and from a synchronous DRAM (syncDRAM) memory for special cases where data is not ready to be transferred. In the event that data is not ready to be transferred between a destination device and the syncDRAM, transfer of data is suspended. Concurrently, at the address from which data was not ready to be transferred, the address is latched by a syncDRAM interface that communicates with the system memory control and the syncDRAM memory. In the event of a read cycle, back-to-back read requests are performed until data can be transferred. In the event of a write request, a mask command is asserted to mask out the data address in the syncDRAM until data is ready to be written to the address, wherein the write request is then reasserted. For both read and write cycles, when data is subsequently ready to be transferred, data transfer is resumed at the latched address. This effectively replaces the clock enable functionality and provides cost savings and die size savings.

18 Claims, 7 Drawing Sheets

METHOD AND APPARATUS FOR CONTROLLING DATA TRANSFER BETWEEN A SYNCHRONOUS DRAM-TYPE MEMORY AND A SYSTEM BUS

The present application is a continuation-in-part (CIP) based on U.S. patent application Ser. No. 08/599,040, filed Feb. 9, 1996 now U.S. Pat. No. 5,926,828, issued Jul. 20, 1999.

FIELD OF THE INVENTION

The present invention generally relates to data communications in a computer system and, more particularly, to memory control design to support synchronous Dynamic Random Access Memory (DRAM) memory.

DESCRIPTION OF RELATED ART

In conventional central processing unit (CPU) design, speed in which data is transferred within the CPU has been increasing rapidly with the advent Reduced Instruction Set (RISC) architectures and even more so due to extensive use of pipelining. However, unlike CPU development, development of different types of memory has concentrated on increasing media density in order to reduce the cost per bit of memory and not speed. This disparity has created an imbalance in memory bandwidth required for small low-cost systems. External interleaving to improve memory bandwidth has been employed to address this problem, but has failed. External interleaving has become a less favorable option due to use of asynchronous interfaces, high timing margins, high data rate, and a lack of registers for control signals, addresses and Input/Outputs (I/Os). The cost external interleaving is also high due to additional glue logic and total memory density required for a given bandwidth. This imbalance created the need for synchronous DRAM-type memory units (syncDRAMs).

SyncDRAMs offer increased memory density with low cost and high bandwidth memory architecture. Furthermore, syncDRAMs are able to support various applications like mainstore, peripherals, graphics and video. SyncDRAMs are designed for a wide range of applications with programmable features such as latency, burst length and burst-type. They can support single or dual bank high frequency and low power operations.

A key feature provided by syncDRAMs is immediate access to multiple blocks of data called "bursts". Burst length refers to the number of words that will be output or input in a read or write cycle respectively. After a read burst has completed, the output bus will become high impedance. The burst length is programmable as 1, 2, 4 or 8 words, or a full page. The ability of the CPU to access these bursts of information give the CPU access to wider bandwidth of memory.

In operation, the syncDRAM is enabled by a command from a memory control unit responding to a data transfer request from the CPU. The syncDRAM responds by enabling an internal clock (CKE#) to begin the command cycle when the clock enable pin is asserted. An address is then internally latched by the syncDRAM from which data will be read or written to. Each time a burst of data is requested, the syncDRAM must go through the initiation sequence in order to access the address from which data will be read or written. The time it takes to complete the initiation process will deficit the overall memory retrieval time needed to access the data.

SUMMARY OF THE INVENTION

According to the invention, there is provided method of performing a burst transfer of data between a memory resource and a device. A burst transfer of data between the memory resource and the device is initiated. If the burst transfer is allowable, a portion of the data is transferred between the memory resource and device and an access address is incremented to reference a subsequent location in the memory resource. If the burst transfer is not allowable, a sequence of back-to-back operations is performed with respect to the access address until the burst transfer becomes allowable.

Other features of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A method and apparatus for controlling data transfer between a synchronous DRAM-type memory and a system bus are described. In the following description, for purposes of explanation, numerous specific details are set forth in order to provide a thorough understanding of the present invention. It will be evident, however, to one skilled in the art that the present invention may be practiced without these specific details.

FIGS. 2 through 6 of the drawings disclose various embodiments of the present invention for the purposes of illustration. One skilled in the art will recognize alternative embodiments that may be employed without departing from the principles of the invention that are illustrated by the structures and methods described herein.

Figure 1:
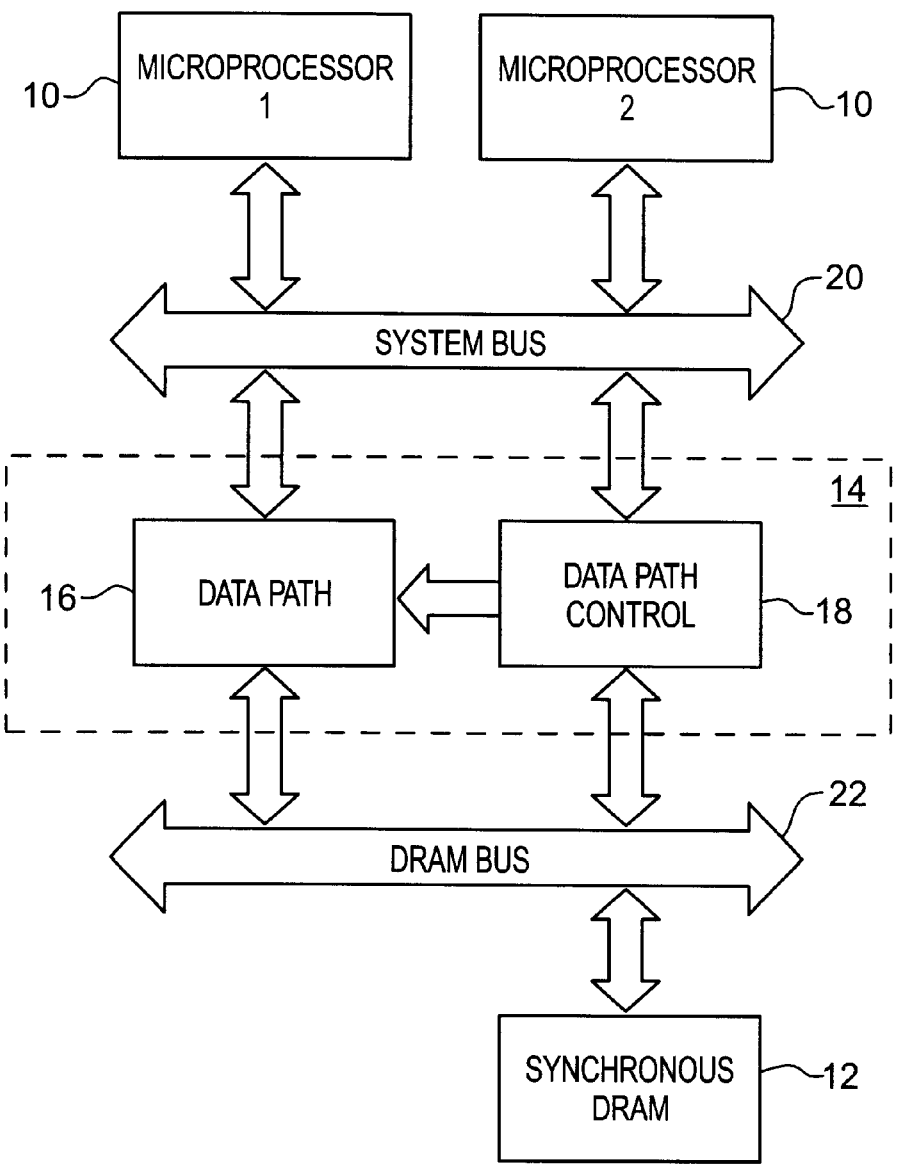
FIG. 1 is a general block diagram of a computer system employing a memory control of the prior art.

The present invention provides a method and apparatus for controlling data transfer between a synchronous DRAM-type memory (syncDRAM) and a system bus. As can be seen in FIG. 1, a computer system may have one or more microprocessors 10 communicating with the system bus 20. A conventional computer system further may comprise various memory banks that can include syncDRAM memory. The microprocessors communicate with the syncDRAM memory 12 through an intermediate memory control 14 included in the intermediate memory control is a datapath 16 through which data is transferred from any one of the microprocessors to the syncDRAM and a data path controller 18 that provides an interface among the datapath 16, the system bus 20 and a DRAM bus 22 that ultimately communicates with the syncDRAM memory 12.

Figure 2:
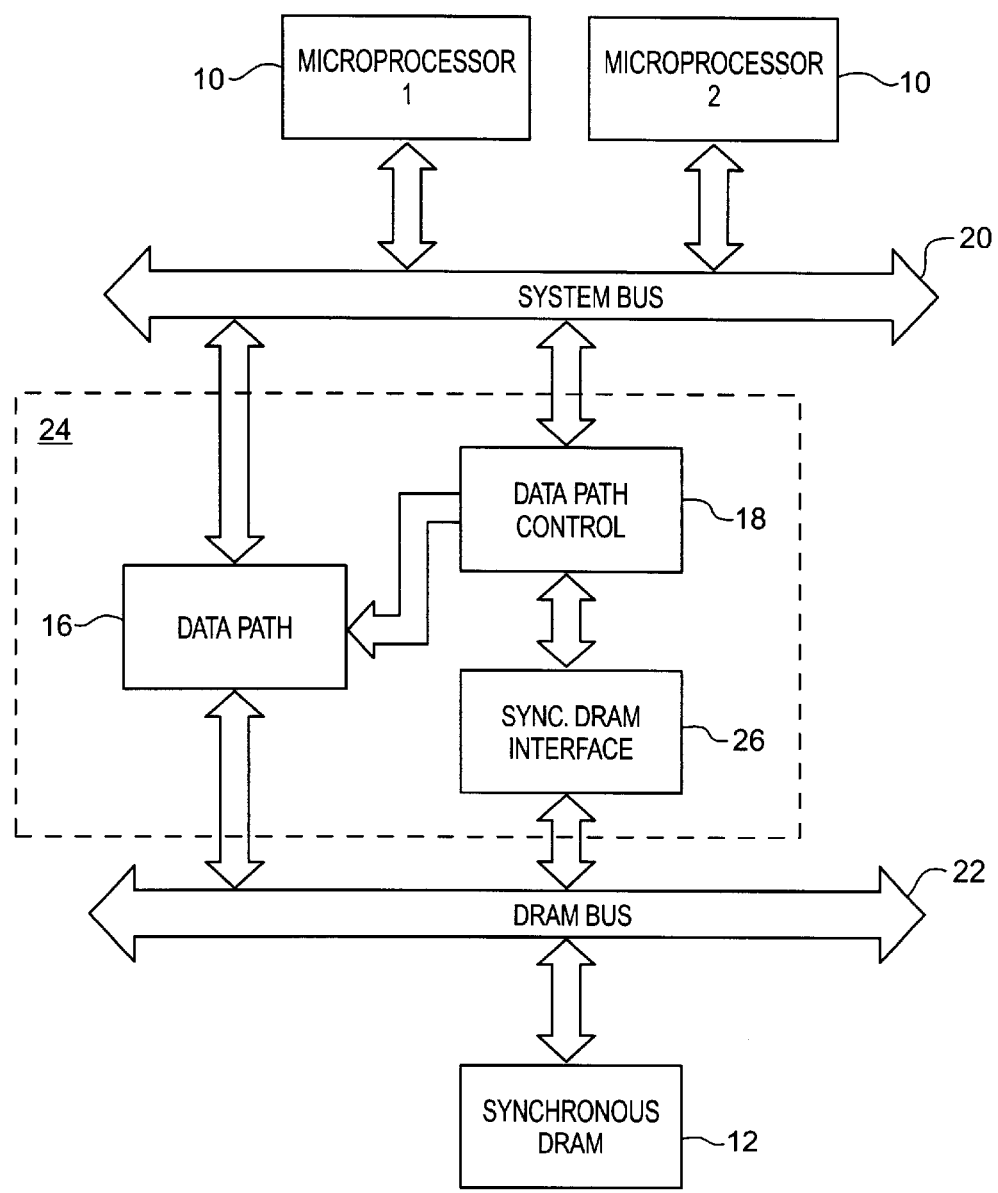
FIG. 2 is a general block diagram of a computer system employing a memory control and a syncDRAM interface in accordance with one embodiment of the present invention.

In one embodiment of the present invention, as illustrated in FIG. 2, the advance memory control 24 operates similarly as conventional memory controls with an included syncDRAM interface 26, a subject of the present invention, for providing special controls during read/write cycles between the system bus and the syncDRAM when data is not ready to be transferred.

In order to understand the operations of the present invention, an explanation of the operations of a syncDRAM is required. The syncDRAM operates similar to its predecessor (the DRAM) with further advanced features. Unlike conventional DRAMs, the syncDRAM is able to provide bursts of data in a series of 0 to 8 words in a single cycle or, when in page mode, can transfer a burst of an entire page to a destination unit. In a typical sequence, a microprocessor in the computer system will send a read or write request through the system bus to the memory control. The memory control will generate a signal which is sent through the DRAM bus to the syncDRAM for execution. Once the command is received by the syncDRAM, the syncDRAM proceeds with a preprogrammed sequence for transferring the data.

The syncDRAM must be initialized in the power-on sequence, much like conventional DRAMs, before data can be transferred. During initialization, the syncDRAM internal clock and data mask must be activated to avoid having data written into the syncDRAM during the sequence. There is typically a 100 ms delay that proceeds any commands being handled by the syncDRAM after the initiation sequence has begun. When asserting a command, a chip enable must be asserted so that commands are recognized by the syncDRAM for execution. Within the syncDRAM, commands executed correspond to the rising edge of the internal clock. When a command is sent to the syncDRAM, a clock enable signal receives the command and determines the validity of the next clock cycle. If the clock enable is high, the next clock rising edge is valid, otherwise it is invalid. If the clock rising edge is invalid, the internal clock is not asserted and the operations in the syncDRAM are suspended. In conventional use, each time a command is asserted to the syncDRAM to transfer data, the chip must be initiated using the chip select and the clock enable in the same clock in order for the command to be recognized by the syncDRAM.

Once the chip is initialized with concurrent chip enable and clock enable commands, data transfer can begin. According to the present burst rate, a series of words is then transferred to the syncDRAM unit in response to a write request or from the syncDRAM unit in response to a read request. In the case where data is not ready to be transferred, either in a read or write request, the syncDRAM continues to transfer the burst of data regardless of the data's readiness. In the case of a read request, data is continually read from an initial burst start address once initiated. Following the initial transfer of the word from the burst start address, an internal address incrementer in the syncDRAM increments the reading pointer to transfer consecutive words following the burst start address up to the end of the burst length preset by the DRAM whether the data path controller is ready to accept data or not. Similarly, during a write sequence, after an initial word is transferred to the burst start address, the internal incrementer then increments the internal address to receive consecutive words following the burst start address in subsequent addresses regardless of whether or not data is ready at the sending device. The data controller 18 determines whether data will be transferred. One embodiment of the present invention provides an interface working in conjunction with the main memory to recognize that the data path controller 18 is not ready to transfer data either from the sending device in the event of a write request or from the syncDRAM in the event of a read request. The syncDRAM is then held in its then present state by issuing back-to-back read requests to the same held address until the receiving device is ready to accept data for a read cycle or by asserting data mask (DQM) commands to mask data in the event of a write cycle.

Figure 3:
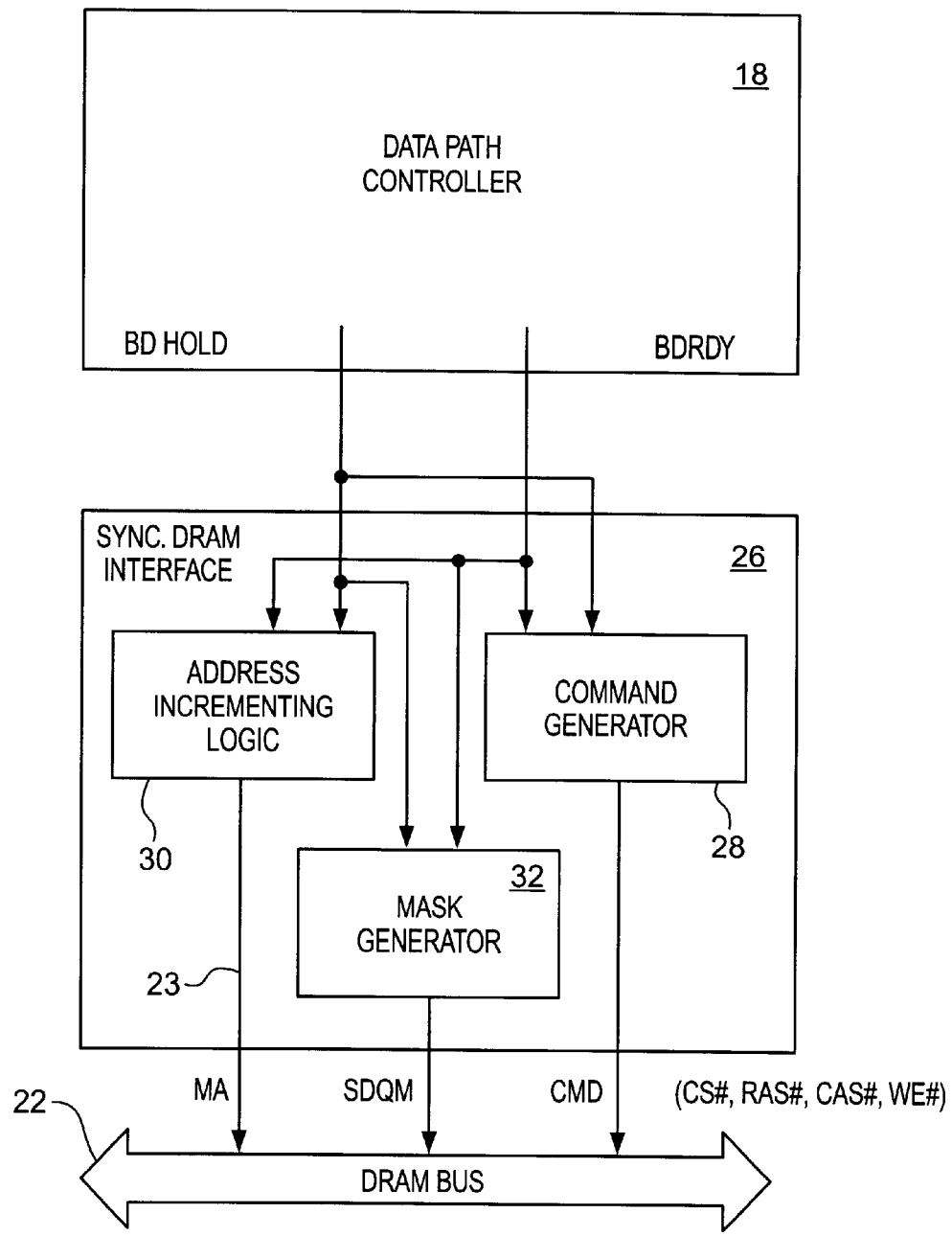
FIG. 3 is a general block diagram of the memory control unit and the syncDRAM interface in accordance with one embodiment of the present invention.

Referring again to FIG. 2, the syncDRAM interface is shown communicating with the data path controller 18 and the DRAM bus 22, with the DRAM bus communicating with the syncDRAM 12. Details of the syncDRAM interface 26 are shown in FIG. 3. The interface 26 includes a command generator 28 communicating with the memory control and the DRAM bus, address incrementing logic 30 communicating with the memory control, the command generator and the DRAM bus and a mask generator 32 communicating with the data path controller 18, the address incrementing logic 30, the command generator 28 and the DRAM bus 22.

Figure 5:
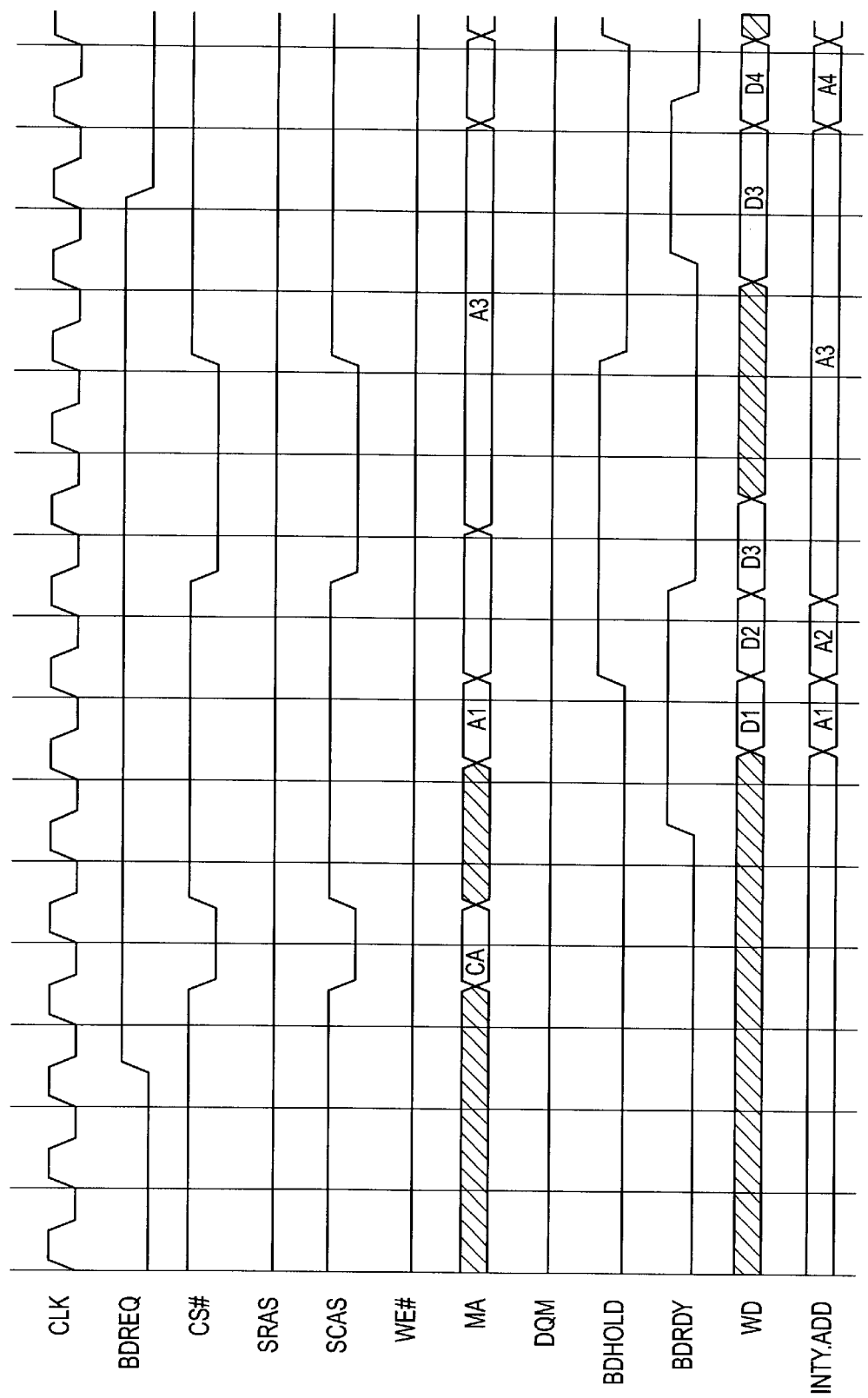
FIG. 5 is a time diagram illustrating commands utilized in read requests in accordance with one embodiment of the present invention.

The command generator produces commands to control the syncDRAM including row address strobe (RAS#), column address strobe (CAS#) and write enable (WE#). A chip select (CS#) in the syncDRAM is conventionally controlled internally. In one embodiment of the present invention however, CS# is held active high externally. This allows for back-to-back read and write requests as will be described in more detail below. These are standard commands that are recognized by syncDRAMs in their conventional implementation. These commands are similar to conventional DRAMs, but have additional functions. In a system where DRAMs and syncDRAMs are implemented among other types of memory in a single computer system, these commands may be distinguished by SCS#, SRAS#, SCAS# and SWE# respectively to associate the commands specifically with the syncDRAM in the system as are illustrated in FIG. 5.

The mask generator 32 controls the syncDRAM command data mask (SDQM) that masks out addresses in the syncDRAM in order to block data from being written into the masked address. This function is used in conjunction with the syncDRAM interface 26 in one embodiment of the present invention.

The syncDRAM interface 26 further includes address incrementing logic 30 that keeps account of the internal address incremented in the syncDRAM during a burst by holding the address in the main memory control. This address is outputted as memory address (MA) lines 23. This function will be described in further detail below.

FIG. 3 also shows the SDRAM 12 as including an internal clock 15, which may be enabled or disabled by the respective assertion or de-assertion of a clock enable signal (CKE#) 13. It will be appreciated that the enablement and disablement of the internal clock 15 effectively serves to activate and de-activate the SDRAM 12. As will be discussed in greater detail below, the data path controller 18 also asserts burst data hold (BDHOLD) and burst data ready (BDRDY) signals.

Details of one embodiment of the present invention are best described by its function which is best described with reference to the flow diagram of FIG. 4. This embodiment will be described in conjunction with the timing diagram of FIGS. 5 and 6 which show respective sequences of commands with respect to time in the case of a read request in FIG. 5 and in the case of a write request in FIG. 6.

Figure 4:
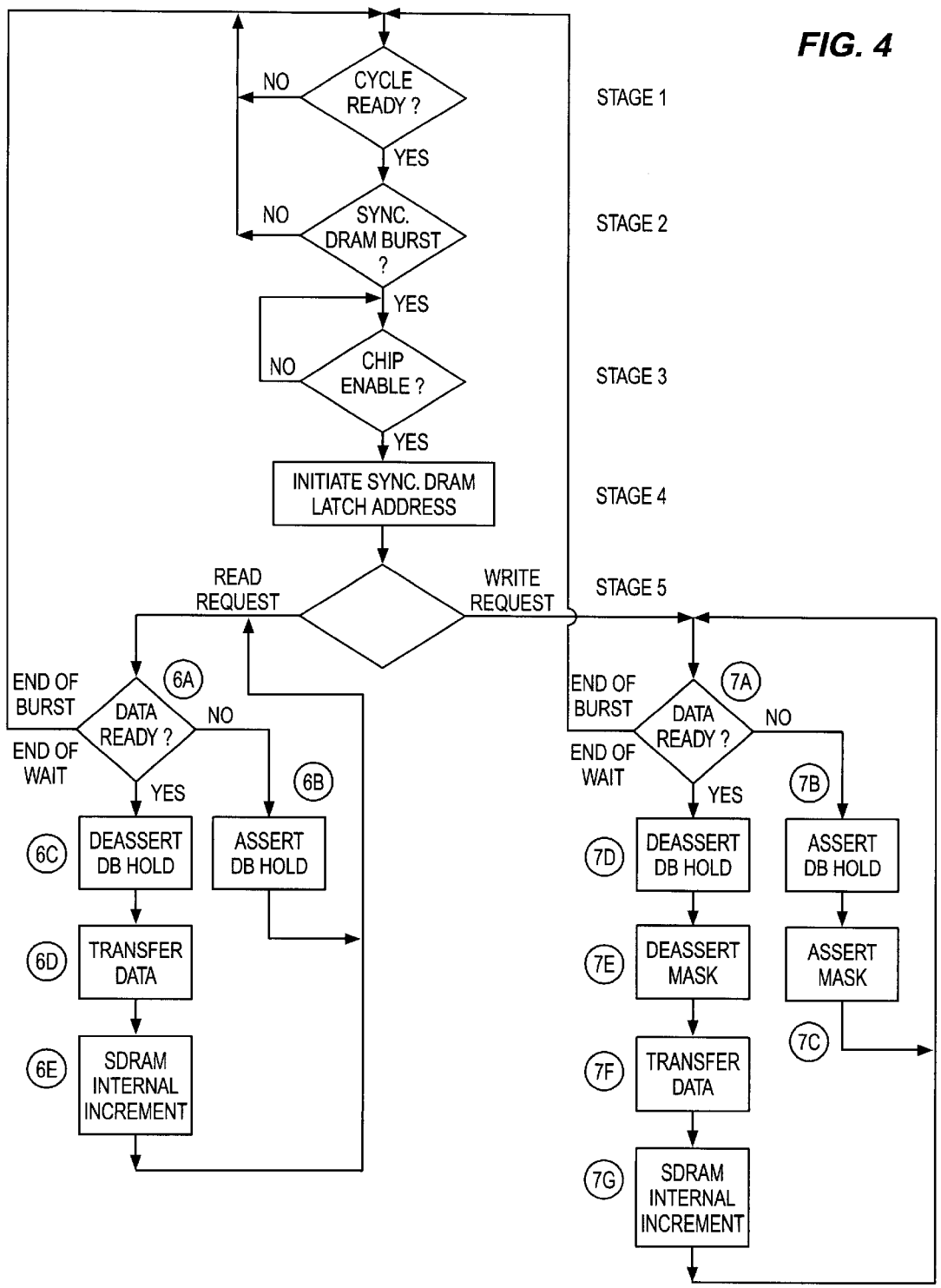
FIG. 4 is a flow chart for describing functional aspects of one embodiment of the present invention.

Referring now to the flow chart of FIG. 4, it can be seen that the first five stages consisting of the initiation of the syncDRAM 12 are common to both read and write requests. In stage 1, the memory control determines whether the cycle is ready. In order for the interface to respond, a primary request must first be sent through the system to begin data transfer from the syncDRAM memory, a primary request being a read or write request originating from a microprocessor in the system and being sent through the system bus and the main memory to initiate the syncDRAM.

The function of the syncDRAM interface in accordance with the present invention operates only in response to a burst sequence that has begun in response to a primary request. This leads to the second requirement in stage 2 where a syncDRAM burst has begun. The syncDRAM is initiated and latches an address to be read from or written to in stage 4. This is accomplished by asserting the read/write command to latch the address to be written to or read from. This is possible because the CKE# is always asserted in this embodiment. As can be seen from the timing diagram of FIG. 5 and FIG. 6, this is true for both read and write requests respectively. In stage 5 in the both read and write request (BDREQ), the data path control must distinguish between read and write requests for the final stages. This is accomplished by asserting a command within the data path control so that the read and write requests are handled accordingly. The data path control then initiates the syncDRAM interface to send back-to-back read or write requests to the syncDRAM.

Still referring to FIG. 4, in the case of a read request, stage 6a comes into play. Under normal circumstances when data is ready, the system proceeds to steps c, d and e where no hold command is asserted and data transfer commences from, at the start, the burst start address. Then, in step 6e, the incrementer internal to the syncDRAM increments the address to the next address subsequent to the burst start address. The system then returns to stage 6a, where it is then determined whether data is ready.

The data receiver indicates its readiness to accept the read data via the BDhold command. Afterward, an internal incrementer shown at stage 6e increments the next address, A2 in FIG. 5, to deliver data D2. In the event that the data is not ready to be received during a read cycle, step 6b comes into play. In the event the interface is not ready to accept the data, it will assert Burst Data Hold (BDhold) to the memory controller. The memory controller in turn will begin initiating back-to-back reads to the required address to effectively stop the burst. In the present case, the controller does back-to-back reads to A3. The address incrementing logic 30 in FIG. 3 continues to latch the internal address A3 shown in FIG. 5 in the event that the data D3 cannot yet be accepted. Once data is ready, the hold command is deserted and two clocks later the data is ready to be read from address A3 with the Burst Data Ready (BDRDY) signal active. From here, the internal incrementer again takes over and provides data D4 from address A4. In this example, the burst rate has been set at 4, so that a burst of four words is read from a single initiation of the syncDRAM. Therefore, at the end of the fourth data word transfer, the burst cycle is ended and the system returns to stage 1 for a new cycle.

In a conventional system without the aid of the syncDRAM interface described in this embodiment, the syncDRAM would continue to read from the data locations indicated by the burst cycle whether or not the interface was ready to accept data. In that case, improper data would be transferred. In order to retrieve proper data in the conventional system, either the clock enable (CKE#) pin would have to be deactivated or a second read request would have to be sent from the microprocessor through the system to initiate the syncDRAM again and perform a second burst to retrieve data items 3 and 4 from addresses A3 and A4. If a second read request were used, it would require enabling the chip and asserting the row address strobe all over again (stages 1–5 in FIG. 4) to retrieve the remaining data items.

With use of the new syncDRAM interface, the syncDRAM is forced to wait while keeping the last address latched where data is not already retrieved so that when the data is ready, the data can be transferred. This saves much needed time lost by constantly readdressing the syncDRAM to retrieve a block of data each time data is not ready. This helps adjust the syncDRAM to the microprocessor and destination devices which all may have different speed and data transfer requirements. If the CKE# pin is used, then one CKE# pin would be required for each synDRAM data bank for throttling each syncDRAM each time data is not ready. In conventional implementations of syncDRAMs, the CKE# pin is used to deactivate the syncDRAM each time data is not ready and to subsequently reactivate the syncDRAM when the data becomes available.

Furthermore, flight time of a signal, that being the time it takes for a signal to travel from its originating source, i. e., the microprocessor, to the syncDRAM device, becomes a major issue on heavily loaded systems. This is why conventional implementations of multiple syncDRAMs require multiple CKE# pins to operate properly. It is important that a data transfer request originating from the main system reaches the syncDRAM on the same clock cycle. The more syncDRAMs that are implemented, the more the system is loaded and, as a result, the longer it takes for the signal to propagate to the syncDRAMs. In a heavily loaded system, the signal may reach the syncDRAM too late, particularly, on the next clock, so that the system will write and spool data into the syncDRAM on the wrong clock. To get around this, if a multiple of syncDRAM memory banks were required for a computer system, a clock enable pin would be needed for each bank to ensure that the load on each pin is minimal. Utilizing the present invention, these pins are not needed. This results in reducing the die size of a controller chip employing this embodiment resulting in cost savings.

Figure 6:
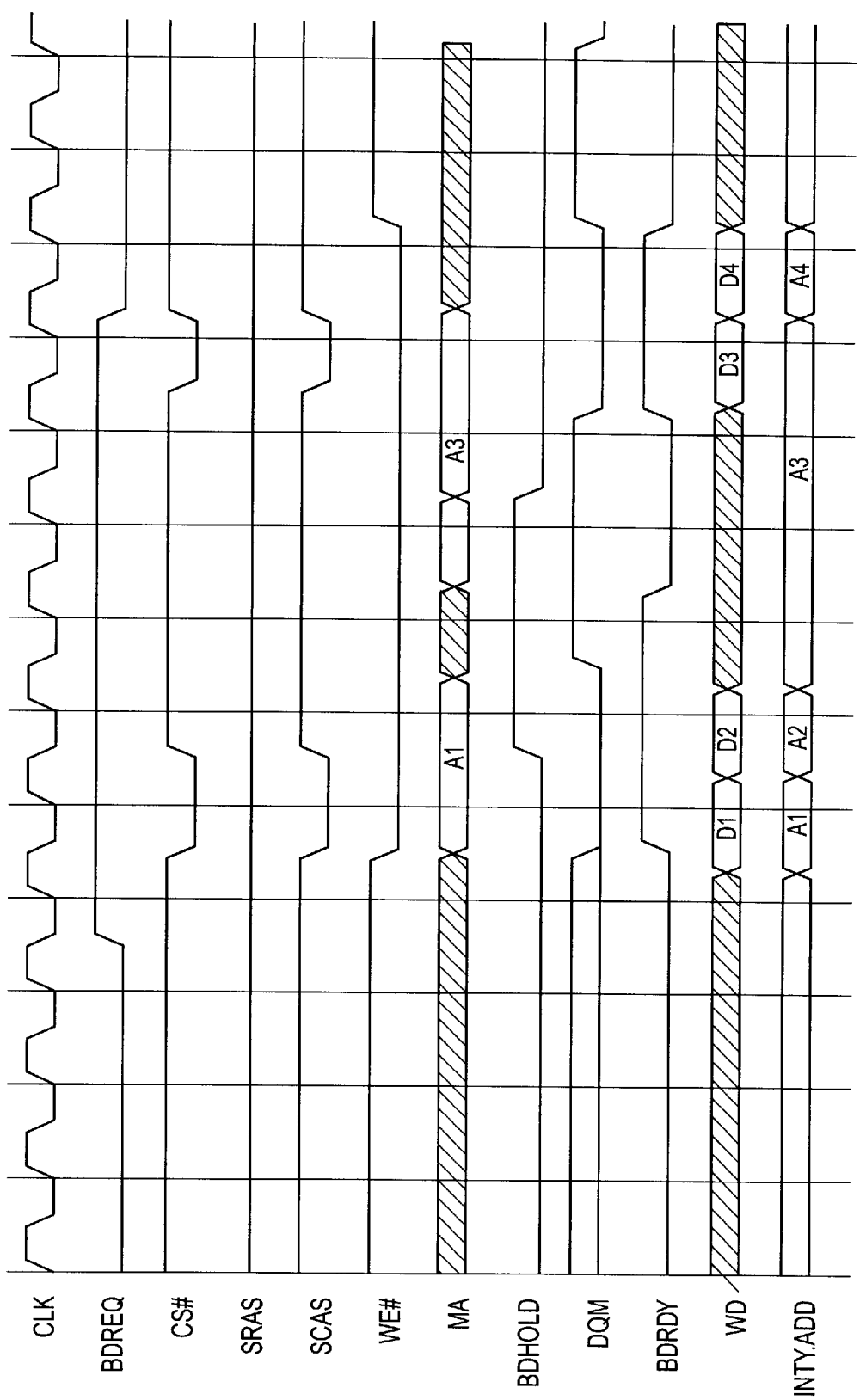
FIG. 6 is a time diagram illustrating commands utilized in write requests in accordance with one embodiment of the present invention.

In the case of a write request, the system proceeds with stage 7a shown in FIG. 4. The corresponding time diagram is shown in FIG. 6. Similar to the read cycle, when data is ready, the system proceeds to steps 7d through g, where the hold signal is not asserted, the data mask DQM is not asserted, data is written to the address, initially at the burst start address and, afterward, the internal syncDRAM address is incremented to the next address following the burst start address. The system then returns back to stage 7a to inquire if data is ready. In the event that data is not ready, the system proceeds to stage 7b where a hold signal is sent to the syncDRAM interface from the data path controller. this operates similarly to the read cycle where the last address latched in the syncDRAM is held latched until data is ready. Simultaneously, the mask generator 32 shown in FIG. 3, asserts a mask signal (DQM) to mask the data in the last address to avoid further writing to the address. Otherwise, the syncDRAM will continue to write invalid data to the address.

As shown in FIG. 6, where this example has only the first two data words available at addresses A1 and A2, once the BDhold signal is asserted, the mask signal DQM is asserted high. As shown in FIG. 6, the DQM signal is low only when data is being written to an address and is high otherwise to ensure that the addresses are masked to avoid invalid data being written to them. Again, in the presently described embodiment, the CKE# pin is continually asserted high. In conventional implementations of syncDRAMs, the CKE# pin would be used to deactivate the syncDRAM in order to prevent continued writing to the syncDRAM when the data path control is not ready to transmit data.

In accordance with this embodiment, the DQM command is held high when the data path controller is not ready to transfer data. This DQM masks the data at the address so that, although data may continue to be sent to the syncDRAM for writing, no data will be written to the masked address.

This configuration allows for elimination of the CKE# pin. In modern computer systems, information flows at progressively higher rates, imposing a heavy load on pins and connectors within the systems. Configurations that can be designed to eliminate those pins can support greater memory loads at higher frequencies and also reduce the die size of the memory controller.

Figure 7:
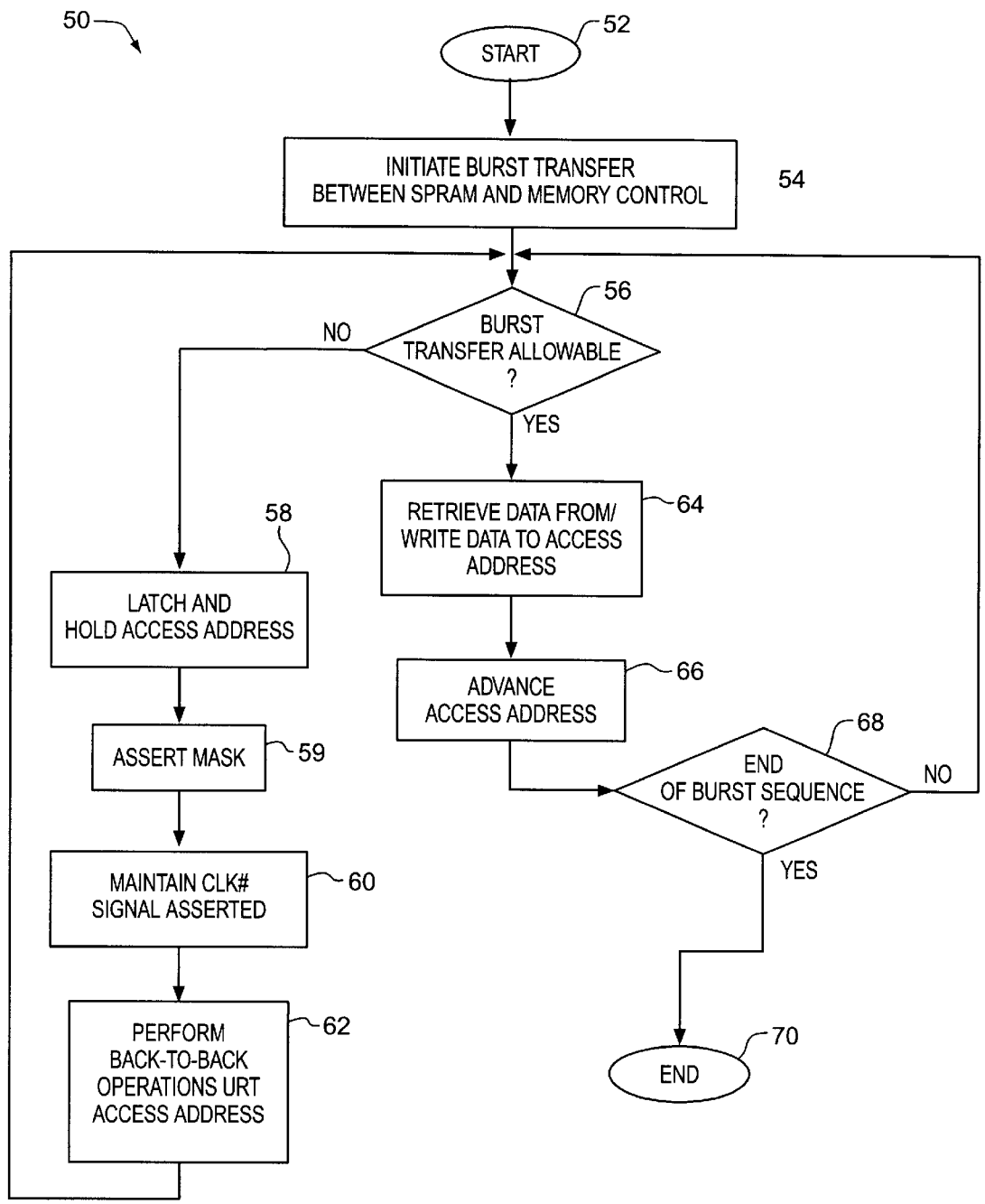
FIG. 7 is a flowchart illustrating a method, according to an exemplary embodiment of the present invention, of performing a burst transfer of data between memory resource and a device.

FIG. 7 is a flowchart illustrating a method 50, according to an exemplary embodiment of the present invention, of performing or controlling a burst transfer of data between a memory resource and a device, the memory resource and the device being coupled to a common bus. In one embodiment of the invention illustrated in FIG. 2, the device may be the memory control 24, the bus may be the DRAM bus 22, and the memory resource may be the synchronous DRAM (SDRAM) memory 12.

The method 50 commences at step 52, and proceeds to process step 54, where a burst transfer of data, for example as defined above, is initiated between the SDRAM 12 and the memory control 24. The burst transfer may be a write operation from the memory control 24 to the SDRAM 12, or a write operation from the SDRAM 12 to the memory controller 24. The burst transfer may furthermore be initiated by the memory control 24 in response to a request from another device within the computer system shown in FIG. 2. At decision box 56, a determination is made as to whether the burst transfer of the data is allowable, as detailed above with reference to FIG. 4. For example, it may be that an interface of the memory control 24 is not ready to accept the data from the SDRAM 12, or that the SDRAM 12 is not ready to provide the data, in the case of a read operation. Alternatively, in the case of a write operation, the SDRAM 12 may not be ready to receive the data from the memory control 24, or the memory control 24 may not be ready to provide the data to the SDRAM 12. In the event that the burst transfer of the data is not allowable (e.g., due to the data not being available at the source or due to the destination not being ready to receive the data), the method 50 proceeds to process step 58, where the address incrementing logic 30 (of the SDRAM interface 26 of the memory control 24) latches an internal address (i.e., access address) of a location within the SDRAM 12 from which data of the burst transfer was to be retrieved, or to which the data of the burst transfer was to the written. For example, referring to FIG. 3, an internal address A3 is latched by the address incrementing logic 30 in the event that data D3 cannot be accepted. At process step 60, the clock enable signal (CKE#) 13, as illustrated in FIG. 3, is maintained in an asserted condition to thereby maintain the internal clock 15 of the SDRAM 12 in an active condition (i.e., the clock enable signal 13 is continually asserted) so that the SDRAM 12 is not de-activated. At process step 62, back-to-back operations are then performed with respect to the internal address of the SDRAM 12 latched at step 58. For example, in the case of a write operation wherein the SDRAM 12 was not ready to accept data into the location reference by the internal address, back-to-back write operations are performed to the latched internal address until the SDRAM 12 is ready to accept data into the relevant location. Alternatively, in the exemplary case of a read operation wherein a destination device (e.g., the memory control 24 or a device downstream thereof) is not ready to receive the read data, back-to-back read operations are performed from the latched internal address until the destination device becomes ready to accept the data. The determination of whether the burst transfer becomes allowable is again made at decision box 56 after the performance of each iteration of back-to-back operations with respect to the latched internal address of the SDRAM 12.

When it is determined at decision box 56 that the burst transfer of data is allowable, the method 50 proceeds to process step 64, where data is retrieved from, or written to, an initial access address (e.g., internal address of the SDRAM 12). Thereafter, the method 50 proceeds to process step 66, wherein the access address is advanced or incremented in the manner described above and in accordance with the methodology used to implement the burst transfer. At decision box 68, a determination is made as to whether the burst transfer has completed. If so, the method 50 then terminates at step 70. If not, the method 50 returns to decision box 56, where a determination is again made us to whether the burst transfer may continue with respect to the incremented access address.

From the above description, it will be apparent that the invention disclosed herein provides a method and apparatus for controlling data transfer between a synchronous DRAM-type memory and a system bus.

Thus, a method and apparatus for controlling data transfer between a synchronous dram-type memory and a system bus has been described. Although the present invention has been described with reference to specific exemplary embodiments, it will be evident that various modifications and changes may be made to these embodiments without departing from the broader spirit and scope of the invention. Accordingly, the specification and drawings are to be regarded in an illustrative rather than a restrictive sense.

What is claimed is:

1. A method of performing a burst transfer of data between a memory resource and a device, the method including:

initiating a burst transfer of data between the memory resource and the device;

determining if the burst transfer of data between the memory resource and the device is allowable;

if the burst transfer of the data is allowable, then transferring a portion of the data and incrementing an access address to reference a subsequent location in the memory resource; and if the burst transfer of the data is not allowable, then maintaining the access address to reference a current location in the memory resource, performing a sequence of back-to-back operations with respect to the access address, so that each operation of the sequence of operations is with respect to the current location in the memory resource, and maintaining an internal clock of the memory resource operational by maintaining a clock enable signal in an asserted state until the burst transfer of the data becomes allowable.

2. The method of claim 1 including determining whether the data is available for transfer between the memory resource and the device.

3. The method of claim 1 including determining whether the device is ready to receive the data from the memory resource.

4. The method of claim 1 including determining whether the memory resource is ready to receive the data from the device.

5. The method of claim 1 wherein the performing of the sequence of back-to-back operations includes maintaining the access address for each of the sequence of back-to-back operations.

6. The method of claim 1 including asserting a hold signal to indicate that the burst transfer of the data is not allowable.

7. The method of claim 1 wherein the burst transfer of the data comprises a read operation from the memory resource, the method including performing a sequence of back-to-back read operations from the access address until the burst transfer of the data becomes allowable.

8. The method of claim 1 wherein the burst transfer of data comprises a write operation to the memory resource, the method including performing a sequence of back-to-back write operations to the access address until the burst transfer of the data becomes allowable.

9. The method of claim 1 including masking the access address to prevent data from being written to, or read from, the access address within the memory resource until the burst transfer of the data becomes allowable.

10. Apparatus for controlling a burst transfer of data between a memory resource and a bus, the apparatus comprising:
 a controller that initiates the burst transfer of the data and that determines whether the burst transfer of the data is allowable;
 a memory interface, if the burst transfer of the data is allowable, to transfer a portion of the data and to increment an access address to reference a subsequent location in the memory resource and that, if the burst transfer of the data is not allowable, to maintain the access address to reference a current location in the memory resource and to perform a sequence of back-to-back operations with respect to the access address, so that each operation of the sequence of back-to-back operations is with respect to the current location in the memory resource, until the burst transfer of the data does become allowable; and
 clock enable circuitry that maintains a clock enable signal to the memory resource in an asserted state if the burst transfer of the data is not allowable.

11. The apparatus of claim 10 wherein the controller asserts a hold signal to indicate that the burst transfer is not allowable, and de-asserts the hold signal to indicate that the burst transfer of the data is allowable.

12. The apparatus of claim 10 wherein the burst transfer of the data comprises a read operation from the memory resource, the memory interface performing a sequence of back-to-back read operations from the access address until the burst transfer of the data becomes allowable.

13. The apparatus of claim 10 wherein the burst transfer of the data comprises a write operation to the memory resource, the interface performing a sequence of back-to-back write operations to the access address until the burst transfer of the data becomes allowable.

14. The apparatus of claim 13 wherein the memory interface includes a mask generator that masks the access address to prevent data from being written to the access address within the memory resource before the burst transfer of the data becomes allowable.

15. The apparatus of claim 10 wherein the memory interface includes address incrementing logic that increments the access address if the burst transfer is allowable.

16. A memory subsystem for use in a computer system, the memory arrangement comprising:
 a memory;
 a controller, coupled to the memory, that initiates a burst transfer of data between the memory and a bus, determines whether the burst transfer of the data is allowable, and maintains a clock enable signal propagated to the memory in an asserted state if the burst transfer is not allowable to thereby maintain an internal clock mechanism of the memory active; and
 a memory interface, if the burst transfer is allowable, to transfer a portion of the data and increment an access address to reference a subsequent location in the memory resource and that, if the burst transfer is not allowable, to maintain the access address to reference a current location in the memory resource and to perform a sequence of back-to-back operations with respect to the access address, so that each operation of the sequence of back-to-back operations is with respect to the current location in the memory resource, until the burst transfer of the data does become allowable.

17. The memory subsystem of claim 16 wherein the controller determines whether the burst transfer of the data between the memory and the bus is allowable.

18. The memory subsystem of claim 17 wherein the controller determines whether the data is available for transfer between the memory and the bus.

* * * * *